US011000911B2

(12) United States Patent
Yang (10) Patent No.: US 11,000,911 B2
(45) Date of Patent: May 11, 2021

(54) MANUFACTURING METHOD FOR BACKLIGHT SOURCE

(71) Applicant: WUHAN CHINA STAR OPTOELECTRONICS TECHNOLOGY CO., LTD., Wuhan (CN)

(72) Inventor: Yong Yang, Wuhan (CN)

( * ) Notice: Subject to any disclaimer, the term of this patent is extended or adjusted under 35 U.S.C. 154(b) by 358 days.

(21) Appl. No.: 16/320,102

(22) PCT Filed: Dec. 4, 2018

(86) PCT No.: PCT/CN2018/119246
§ 371 (c)(1),
(2) Date: Jan. 24, 2019

(87) PCT Pub. No.: WO2020/087652
PCT Pub. Date: May 7, 2020

(65) Prior Publication Data
US 2020/0261994 A1    Aug. 20, 2020

(30) Foreign Application Priority Data
Oct. 31, 2018   (CN) .......................... 201811290147.3

(51) Int. Cl.
*B23K 1/002* (2006.01)
*G02F 1/13357* (2006.01)
(Continued)

(52) U.S. Cl.
CPC ........ *B23K 1/002* (2013.01); *G02F 1/133603* (2013.01); *H01L 25/0753* (2013.01);
(Continued)

(58) Field of Classification Search
CPC .. H05K 3/3436; H05K 3/3489; H05K 3/1216; H05K 3/3431; H05K 3/3494;
(Continued)

(56) References Cited

U.S. PATENT DOCUMENTS 10,546,846 B2 * 1/2020 Lowes ...................... F21K 9/64
2006/0063351 A1 * 3/2006 Jain ..................... H01L 21/6835
438/455
(Continued)

FOREIGN PATENT DOCUMENTS

CN      206519637 U  *  9/2017
CN      108288591 A  *  7/2018

*Primary Examiner* — Kevin Quarterman (57) ABSTRACT

The present invention provides a method for manufacturing a backlight source. The method for manufacturing a backlight source according to the present invention forms a plurality of tin soldering pattern groups on a substrate. Each tin soldering pattern group includes tin soldering patterns spaced from one another, and the tin soldering patterns are in a closed ring shape. The Mini-LEDs are disposed on the tin soldering pattern groups respectively. The substrate is placed in the space having a varying magnetic field. The circuit of the tin soldering patterns in the tin soldering pattern groups generates the induced current for rapid heating and melting, to solder the Mini-LEDs on the substrate. The soldering speed is improved, the process efficiency is high, the process cost is low, and the light effect of the backlight source is effectively ensured.

10 Claims, 8 Drawing Sheets

(51) Int. Cl.
*H01L 25/075* (2006.01)
*H01L 33/62* (2010.01)
*H05K 3/34* (2006.01)
*B23K 101/36* (2006.01)

(52) U.S. Cl.
CPC ........... *H01L 33/62* (2013.01); *H05K 3/3436* (2013.01); *H05K 3/3489* (2013.01); *B23K 2101/36* (2018.08); *H01L 2933/0066* (2013.01)

(58) Field of Classification Search
CPC ..... H05K 2203/0415; H05K 2203/104; H05K 2201/10106; H05K 3/34; B23K 1/002; B23K 2101/36; B23K 1/0016; G02F 1/133603; G02F 1/133612; H01L 25/0753; H01L 33/62; H01L 2933/0066
See application file for complete search history.

(56) References Cited

U.S. PATENT DOCUMENTS

| | | | |
|---|---|---|---|
| 2014/0048821 A1* | 2/2014 | Inoue | H01L 33/32 257/76 |
| 2014/0191276 A1* | 7/2014 | Kim | H01L 33/58 257/99 |

* cited by examiner

MANUFACTURING METHOD FOR BACKLIGHT SOURCE

FIELD OF INVENTION

The present invention relates to the technical field of display, and in particular to a method for manufacturing a backlight source.

BACKGROUND OF INVENTION

With the development of display technology, flat display devices such as liquid crystal displays (LCDs) are widely used in various consumer electronic products such as mobile phones, televisions, personal digital assistants, digital cameras, notebook computers, and desktop computers due to the advantages of high image quality, power saving, thin bodies and wide application range, and have become mainstream in the display devices.

Most of the liquid crystal display devices on the market are backlight type liquid crystal display devices, and include a liquid crystal display panel and a backlight module. The working principle of the liquid crystal display panel is disposing liquid crystal molecules between two parallel glass substrates. There are many vertical and horizontal small wires between the two glass substrates. The direction of the liquid crystal molecules is controlled to be changed by energizing or not, and the light of the backlight module is refracted to produce a picture.

The liquid crystal display panel does not emit light per se, and an image needs to be displayed normally by a light source provided by the backlight module. Therefore, the backlight module becomes one of the key components of the liquid crystal display device. The backlight module is divided into a side-lit type backlight module and a direct-lit backlight module according to different incident positions of the light source. For the direct-lit type backlight module, the backlight source such as a cathode fluorescent lamp (CCFL) or a light-emitting diode (LED) light source is disposed behind the liquid crystal display panel, and the light is uniformized by a diffusion plate to form a surface light source to be supplied to the liquid crystal display panel.

The Mini-LED, also known as sub-millimeter light-emitting diode, is applied to the backlight module. Compared with the conventional side-lit backlight, a light guide plate is not required to be disposed, thinner and lighter effects are realized, the light-emitting efficiency is higher, the limitation of a mixing light distance is also solved, the phenomenon of a hotspot of the side-light-emitting backlight is not generated, and the suitability for a narrow-screen full-screen product is realized. Meanwhile, the Mini-LED can also achieve sub-area control of the backlight to achieve near-perfect dark state performances, the contrast ratio is higher, and the display quality is better.

However, there are still many defects in the preparing process of the Mini-LED. One of the defects is the problem about die bonding of a chip. Due to the cost, people prefer to use smaller chips for die bonding. However, in the traditional chip die-bonding reflow soldering process, since the melt flow time of solder paste is relatively long and the weight of the chip is light, the pull offset of the solder paste is easily caused, and thus the uneven brightness of the entire surface of the Mini-LED is caused, and the light effect is affected.

SUMMARY OF INVENTION

An objective of the present invention is to provide a method for manufacturing a backlight source, which is high in process efficiency and low in process cost, and effectively ensures the light effect of the backlight source.

In order to achieve the above objective, the present invention provides a method for manufacturing a backlight source, including steps as follows: step S1: providing a substrate; step S2: forming a plurality of tin soldering pattern groups spaced from one another on the substrate, each tin soldering pattern group including a plurality of tin soldering patterns spaced from one another, and each tin soldering pattern being in a closed ring shape; step S3: providing a plurality of mini light-emitting diodes (Mini-LEDs), and disposing the Mini-LEDs on the tin soldering pattern groups respectively; and step S4: placing the substrate subjected to the step S3 into a space having a varying magnetic field, to cause the tin soldering patterns in the tin soldering pattern groups to generate an induced current to be heated and molten, and soldering the Mini-LEDs on the substrate.

The substrate includes a plurality of bonding pad groups spaced from one another, and each bonding pad group includes two bonding pads spaced from one another.

The tin soldering pattern groups formed in step S2 correspond to the bonding pad groups respectively. Each tin soldering pattern group includes two tin soldering patterns. The two tin soldering patterns of each tin soldering pattern group are formed on the two bonding pads of the corresponding bonding pad group respectively.

The Mini-LED includes two pins corresponding to the two tin soldering patterns of the corresponding tin soldering pattern group respectively. After step S3 is finished, each pin is located on the corresponding tin soldering pattern or located in a region encircled by the corresponding tin soldering pattern.

In the step S4, the two tin soldering patterns of each tin soldering pattern group are molten to solder the two pins of the corresponding Mini-LED to the two bonding pads of the corresponding bonding pad group respectively.

Before the tin soldering pattern groups are formed on the substrate in the step S2, a plurality of soldering flux pattern groups corresponding to the bonding pad groups respectively are also formed on the substrate. Each soldering flux pattern group includes two soldering flux patterns spaced from one another. The two soldering flux patterns of each soldering flux pattern group are formed on the two bonding pads of the corresponding bonding pad group respectively. The two tin soldering patterns of each tin soldering pattern group are formed on the soldering flux patterns on the two bonding pads of the corresponding bonding pad group respectively.

An area of the soldering flux pattern is 0.8 to 1 times an area of the bonding pad thereunder.

A specific manner of forming a plurality of tin soldering pattern groups spaced from one another on the substrate is to firstly provide a tin soldering steel mesh. The tin soldering steel mesh includes a first shielding portion, a plurality of second shielding portions and a plurality of connecting portions corresponding to the second shielding portions respectively. The first shielding portion is provided with a plurality of openings spaced from one another. The second shielding portions are correspondingly located in the openings and are connected to the first shielding portion by the corresponding connecting portions. Next, the tin soldering steel mesh is used as a cover to spray a tin soldering material toward the substrate, to form the tin soldering pattern groups spaced from one another on the substrate, each tin soldering pattern group including a plurality of closed and ring-shaped tin soldering patterns.

The soldering flux pattern groups are manufactured by spraying of a steel mesh.

A thickness of the soldering flux patterns is 1 to 5 micrometers.

The tin soldering patterns are circular rings or polygonal rings, and a thickness of the tin soldering patterns is 20 to 50 micrometers.

In the step S4, a change rate of magnetic flux of the space with a varying magnetic field, in which the substrate subjected to the step S3 is placed, is $5 \times 10^4$-$2 \times 10^{-3}$ Wb/s. A temperature at which the tin soldering patterns in the tin soldering pattern groups generate the induced current for heating is 240° C. to 280° C.

The substrate is a printed circuit board or flexible circuit board.

The present invention has the beneficial effects that the method for manufacturing a backlight source provided by the present invention forms a plurality of tin soldering pattern groups on the substrate. Each tin soldering pattern group includes a plurality of tin soldering patterns spaced from one another, and the tin soldering patterns are in a closed ring shape. The Mini-LEDs are correspondingly disposed on the tin soldering pattern groups. The substrate is placed in the space having a varying magnetic field. The circuit of the tin soldering patterns in the tin soldering pattern groups generates the induced current for rapid heating and melting, to solder the Mini-LEDs on the substrate. The soldering speed is improved, the process efficiency is high, the process cost is low, and the light effect of the backlight source is effectively ensured.

BRIEF DESCRIPTION OF DRAWINGS

To provide a further understanding of the features and technical contents of the present invention, reference can be made to the following detailed description of the present invention and the accompanying drawings. However, the accompanying drawings are merely used for reference and illustration, and are not intended to limit the present invention.

In the figures.

DETAILED DESCRIPTION OF PREFERRED EMBODIMENTS

To further explain the technical means and effects of the present invention, a detailed description is given below with reference to preferred embodiments of the present invention and the accompanying drawings.

Figure 1:
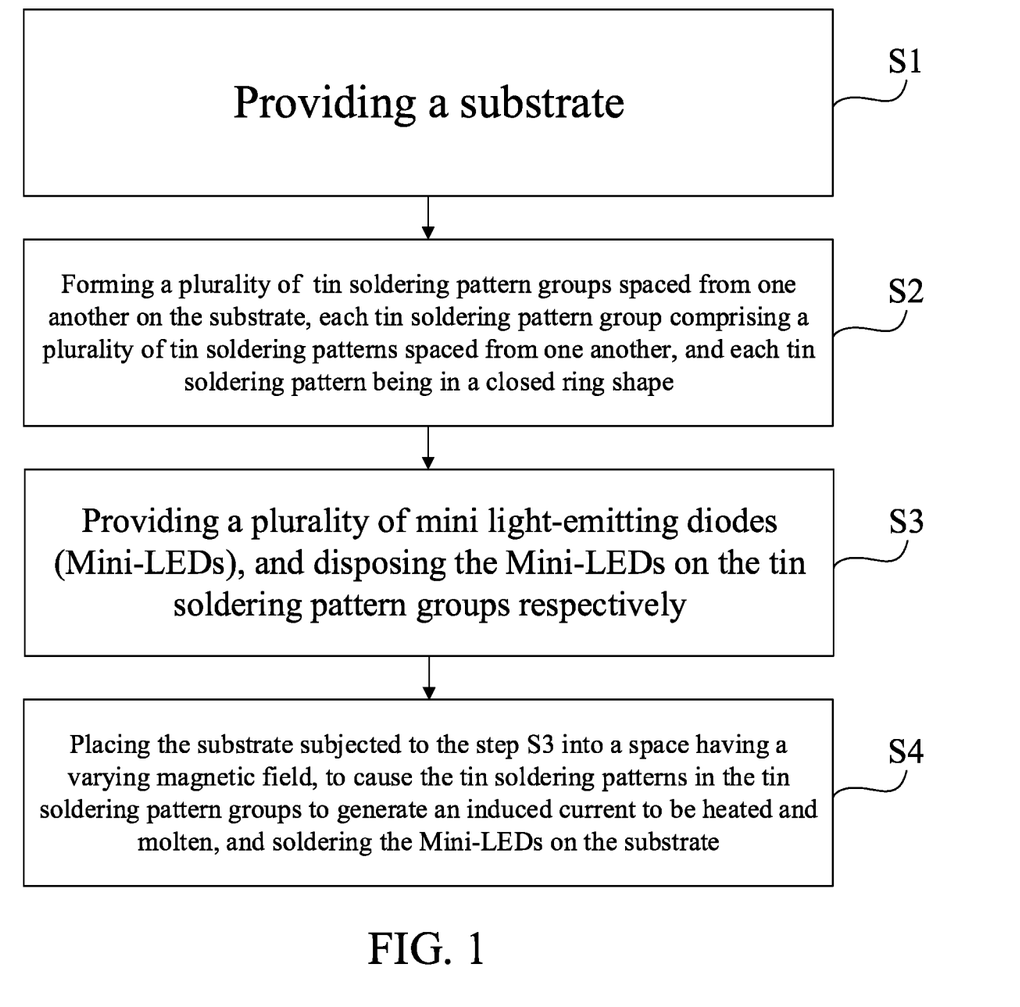
FIG. 1 is a flow chart of a method for manufacturing a backlight source according to the present invention.

Referring to FIG. 1, the present invention provides a method for manufacturing a backlight source, which includes steps as follows.

Figure 2:
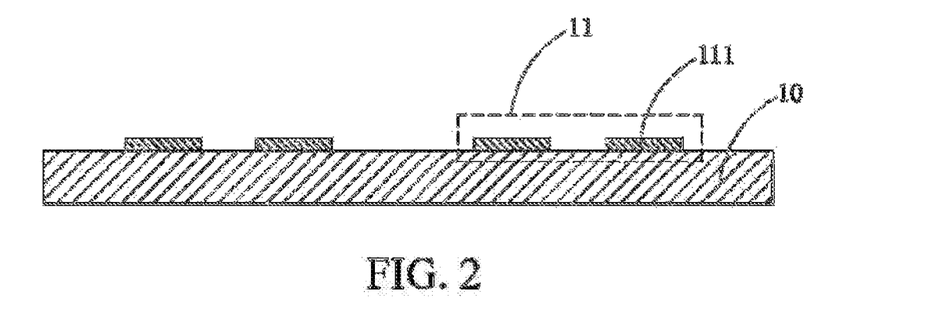
FIG. 2 is a schematic diagram of step S1 of the method for manufacturing a backlight source according to the present invention.

Step S1, referring to FIG. 2, a substrate 10 is provided.

Specifically, the substrate 10 includes a plurality of bonding pad groups spaced from one another 11. Each bonding pad group 11 includes two bonding pads spaced from one another 111.

Further, the substrate 10 further includes copper wires respectively connected to the bonding pads 111 and white oil (not shown) for reflecting light.

Specifically, the substrate 10 is a printed circuit board (PCB) with rigid plastic as a substrate or a flexible circuit board (FPC) with a polyimide material as a substrate.

Specifically, after the substrate 10 is provided in the step S1, the substrate 10 is cleaned.

Figure 4:
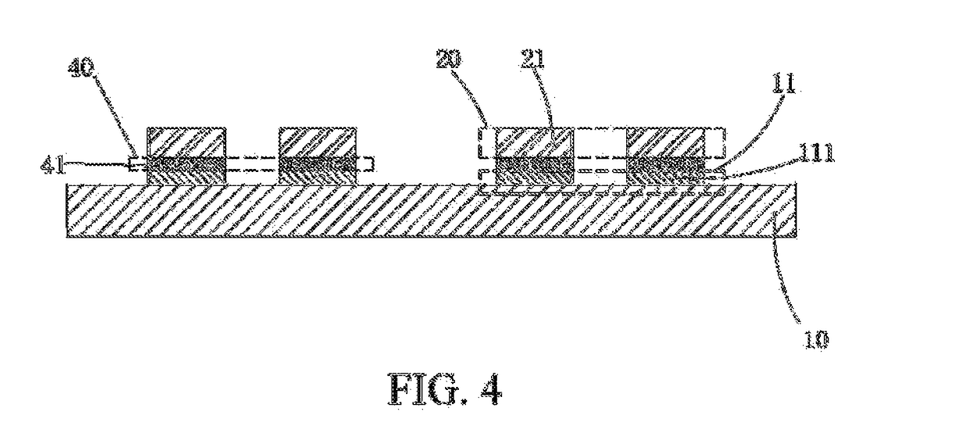
Figure 5:
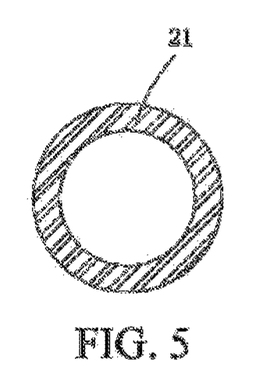
FIG. 5 is a top schematic view of a tin soldering pattern in a first embodiment of the method for manufacturing a backlight source according to the present invention.
Figure 6:
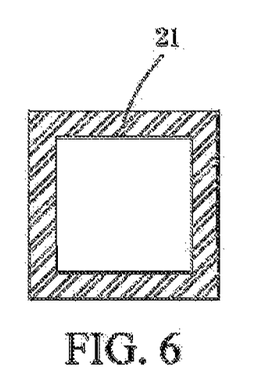
FIG. 6 is a top schematic view of a tin soldering pattern in a second embodiment of the method for manufacturing a backlight source of the present invention.
Figure 7:
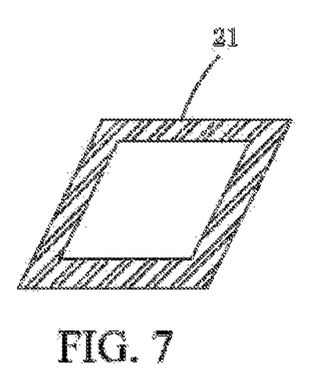
FIG. 7 is a top schematic view of a tin soldering pattern in a third embodiment of the method for manufacturing a backlight source according to the present invention.
Figure 8:
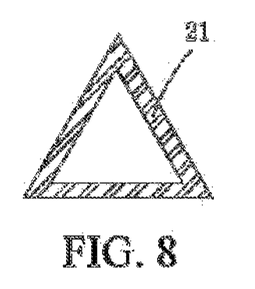
FIG. 8 is a top schematic view of a tin soldering pattern in a fourth embodiment of the method for manufacturing a backlight source according to the present invention.
Figure 9:
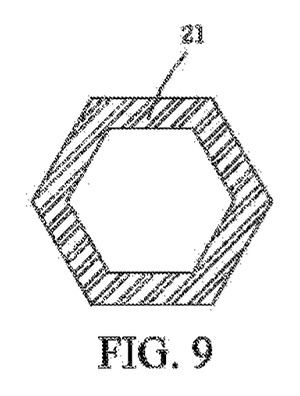
FIG. 9 is a top schematic view of a tin soldering pattern in a fifth embodiment of the method for manufacturing a backlight source according to the present invention.

Step S2, referring to FIG. 4, a plurality of tin soldering pattern groups spaced from one another 20 are formed on the substrate 10. Each tin soldering pattern group 20 includes a plurality of tin soldering patterns spaced from one another 21. Each tin soldering pattern 21 is in a closed ring shape.

Specifically, the tin soldering pattern groups 20 formed in the step S2 respectively correspond to the bonding pad groups 11. Each tin soldering pattern group 20 includes two tin soldering patterns 21. The two tin soldering patterns 21 of each tin soldering pattern group 20 are formed on the two bonding pads 111 of the corresponding bonding pad group 11 respectively.

Specifically, referring to FIG. 5 to FIG. 9, the tin soldering pattern 21 may be a circular ring, or may be a square ring, a diamond ring, a triangular ring, a hexagonal ring, and a polygonal ring with other side numbers, as long as the tin soldering pattern 21 is guaranteed to be in the closed ring shape.

Preferably, the tin soldering pattern 21 has a thickness of 20 to 50 micrometers.

Specifically, the tin soldering pattern groups 20 are formed on the substrate 10 by spraying of a steel mesh.

Figure 10:
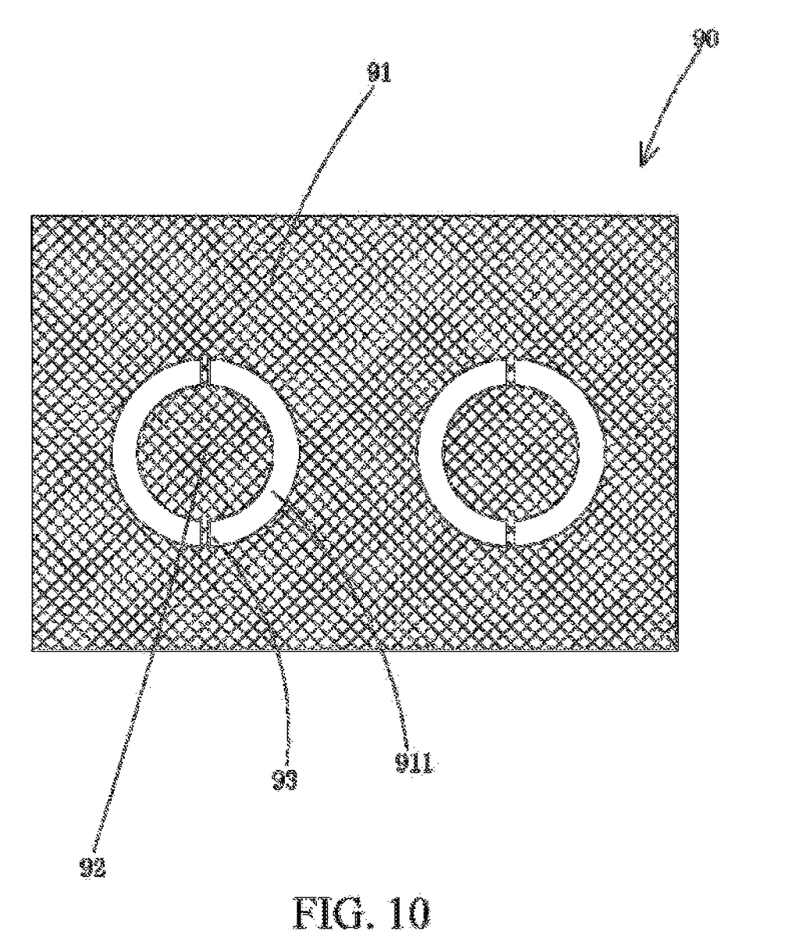
FIG. 10 is a partial structural schematic view of a tin soldering steel mesh in the first embodiment of the method for manufacturing a backlight source according to the present invention.

Further, referring to FIG. 10, by taking a first embodiment of the present invention as an example, a specific manner of forming the tin soldering pattern groups 20 spaced from one another on the substrate 10 is to provide a tin soldering steel mesh 90 at first. The tin soldering steel mesh 90 includes a first shielding portion 91, a plurality of circular second shielding portions 92, and a plurality of connecting portions 93 corresponding to the second shielding portions 92. The first shielding portion 91 is provided with a plurality of circular openings 911 from one another. The second shielding portions 92 are located in the openings 911 respectively and connected to the first shielding portion 91 by the corresponding connecting portions 93. Next, a tin soldering material is sprayed to the substrate 10 with the tin soldering steel mesh 90 as a cover. The tin soldering pattern groups 20 spaced from one another are formed on the substrate 10. Each tin soldering pattern group 20 includes a plurality of closed and ring-shaped tin soldering patterns 21. It can be understood that in other embodiments of the present invention, the shape of the second shielding portions 92 and the shape of the openings 911 may be set to a polygon such as a triangle, a square, a diamond, or a hexagon, so as to cause the finally formed tin soldering patterns 21 to be in the closed polygonal ring shape.

Figure 3:
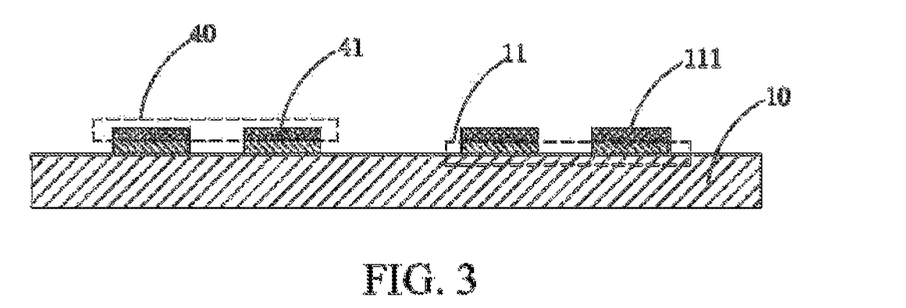
FIG. 3 and FIG. 4 are schematic diagrams of step S2 of the method for manufacturing a backlight source according to the present invention.

Specifically, referring to FIG. 3 and FIG. 4, before the tin soldering pattern groups 20 are formed on the substrate 10 in the step S2, a plurality of soldering flux pattern groups 40 respectively corresponding to the bonding pad groups 11 are further formed on the substrate 10. Each soldering flux pattern group 40 includes two soldering flux patterns 41 spaced from one another. The two soldering flux patterns 41 of each soldering flux pattern group 40 are formed on the two bonding pads 111 of the corresponding bonding pad group 11 respectively. The two tin soldering patterns 21 of each tin soldering pattern group 20 are formed on the soldering flux patterns 41 on the two bonding pads 111 of the corresponding bonding pad group 11 respectively.

Preferably, an area of the soldering flux pattern 41 is 0.8 to 1 times an area of the bonding pad 111 thereunder. The thickness of the soldering flux pattern 41 is 1 to 5 micrometers.

Specifically, the soldering flux pattern groups 40 are manufactured by spraying of a steel mesh.

Figure 11:
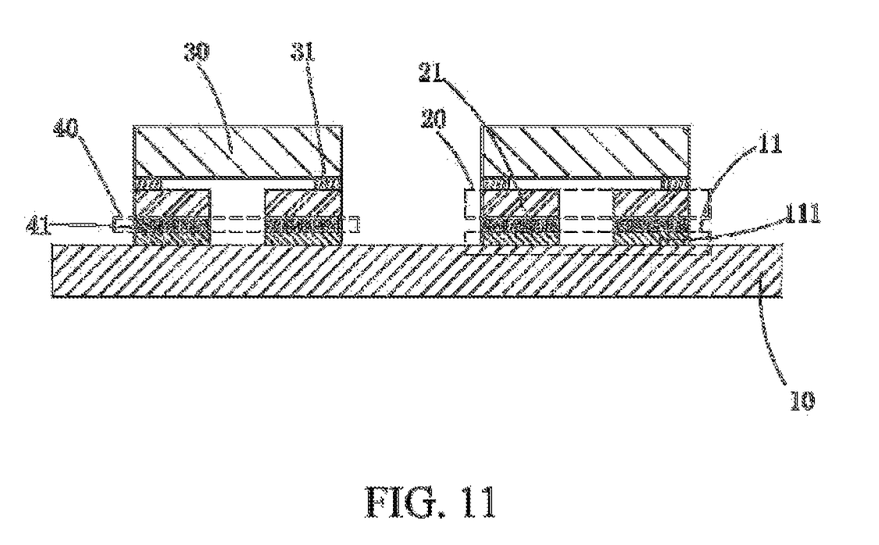
FIG. 11 is a schematic diagram of step S3 of the method for manufacturing a backlight source according to the present invention.

Step S3, referring to FIG. 11, a plurality of mini light-emitting diodes (Mini-LEDs) 30 are provided. The Mini-LEDs 30 are correspondingly disposed on the tin soldering pattern groups 20.

Specifically, the Mini-LED 30 includes two pins 31 respectively corresponding to the two tin soldering patterns 21 of the corresponding tin soldering pattern group 20. After the step S3 is finished, each pin 31 is located on the corresponding tin soldering pattern 21 or in a region encircled by the corresponding tin soldering pattern 21.

Figure 12:
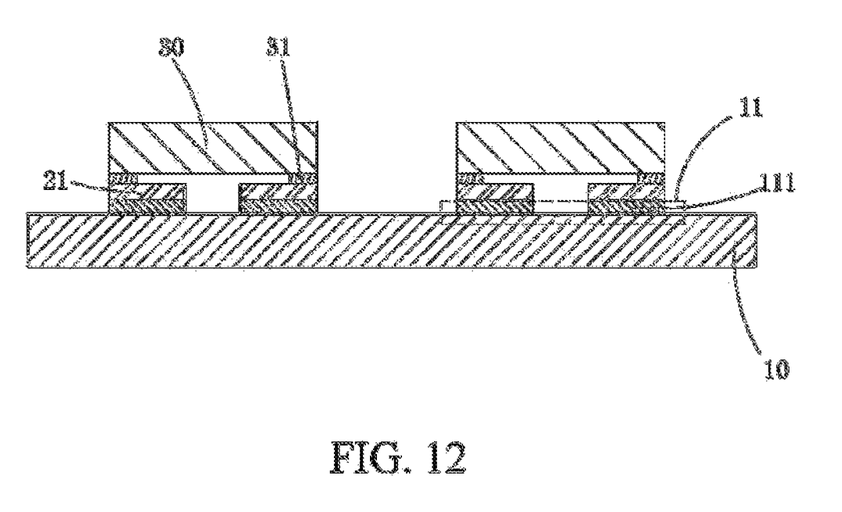
FIG. 12 is a schematic diagram of step S4 of the method for manufacturing a backlight source according to the present invention.

Step S4, referring to FIG. 12, the substrate 10 subjected to the step S3 is placed in a space having a varying magnetic field. The tin soldering patterns 21 in the tin soldering pattern groups 20 are caused to generate an induced current by the continuous change of the magnetic field. The induced current generates heat in a closed circuit of the tin soldering patterns 21, so that the tin soldering patterns 21 are heated and molten and quickly flattened from the periphery to the center. Meanwhile, the soldering flux patterns 41 are volatilized by heat. Finally the molten tin soldering patterns 21 will solder the Mini-LEDs 30 on the substrate 10.

Specifically, in the step S4, the two tin soldering patterns 21 of each tin soldering pattern group 20 are molten. The two pins 31 of the corresponding Mini-LED 30 are respectively soldered with the two bonding pads 111 of the corresponding bonding pad group 11.

Preferably, in the step S4, a change rate of magnetic flux of the space with the varying magnetic field, in which the substrate 10 subjected to the step S3 is placed, is $5 \times 10^{-4}$-$2 \times 10^{-3}$ Wb/s, so that the tin soldering patterns 21 in the tin soldering pattern groups 20 generate an induced current and the heating temperature is 240° C. to 280° C.

It should be noted that, according to the present invention, by forming the tin soldering pattern groups 20 including the closed and ring-shaped tin soldering patterns 21 on the substrate 10, after the Mini-LEDs 30 are correspondingly disposed on the tin soldering pattern groups 20 on the substrate 10, by placing the substrate 10 in the space having the varying magnetic field, the tin soldering patterns 21 are heated by the induced current to be quickly molten and flattened. The soldering tin in the "mountain-like" shape in the existing soldering process is avoided. The Mini-LEDs 30 can be quickly soldered on the substrate 10. The soldering speed is fast. The process efficiency is high. The rapid cooling of the tin soldering does not cause excessive pull and tilt of the Mini-LEDs 30, thereby ensuring the light effect of the backlight source. Meanwhile, by adopting the manner of induced current soldering, the purpose of saving energy consumption is achieved to reduce the production cost of the backlight source. In addition, since the induced current exists only in the closed circuit of the tin soldering patterns 21, other areas on the substrate 10, such as a copper line area and a white oil area, are not affected by high temperature. It is ensured that the panel will not have serious expansion and contraction and curl. The reflectivity of the white oil will not be reduced by the high temperature soldering process, thereby ensuring the better light effect and light mixing effect and improving the quality of the backlight source.

In summary, the method for manufacturing a backlight source provided by the present invention forms a plurality of tin soldering pattern groups on the substrate. Each tin soldering pattern group includes a plurality of tin soldering patterns spaced from one another, and the tin soldering patterns are in a closed ring shape. The Mini-LEDs are disposed on the tin soldering pattern groups respectively. The substrate is placed in the space having the varying magnetic field. The circuit of the tin soldering patterns in the tin soldering pattern groups generates the induced current for rapid heating and melting, to solder the Mini-LEDs on the substrate. The soldering speed is improved, the process efficiency is high, the process cost is low, and the light effect of the backlight source is effectively ensured.

Based on the above, those of ordinary skill in the art may make various variations and modifications according to the technical solutions and ideas of the present invention, and such variations and modifications shall all fall within the protection scope of the present invention as defined by the appended claims.

What is claimed is:

1. A method for manufacturing a backlight source, comprising steps as follows:
   step S1: providing a substrate;
   step S2: forming a plurality of tin soldering pattern groups spaced from one another on the substrate, each tin soldering pattern group comprising a plurality of tin soldering patterns spaced from one another, and each tin soldering pattern being in a closed ring shape;
   step S3: providing a plurality of mini light-emitting diodes (Mini-LEDs), and disposing the Mini-LEDs on the tin soldering pattern groups respectively; and
   step S4: placing the substrate subjected to the step S3 into a space having a varying magnetic field, to cause the tin soldering patterns in the tin soldering pattern groups to generate an induced current to be heated and molten, and soldering the Mini-LEDs on the substrate.

2. The method for manufacturing a backlight source according to claim 1, wherein:
   the substrate comprises a plurality of bonding pad groups spaced from one another, and each bonding pad group comprises two bonding pads spaced from one another;
   the tin soldering pattern groups formed in the step S2 correspond to the bonding pad groups respectively;

each tin soldering pattern group comprises two tin soldering patterns; and the two tin soldering patterns of each tin soldering pattern group are formed on the two bonding pads of the corresponding bonding pad group respectively;

the Mini-LED comprises two pins corresponding to the two tin soldering patterns of the corresponding tin soldering pattern group respectively; after the step S3 is finished, each pin is located on the corresponding tin soldering pattern or located in a region encircled by the corresponding tin soldering pattern; and in the step S4, the two tin soldering patterns of each tin soldering pattern group are molten to solder the two pins of the corresponding Mini-LED to the two bonding pads of the corresponding bonding pad group respectively.

3. The method for manufacturing a backlight source according to claim 2, wherein before the tin soldering pattern groups are formed on the substrate in the step S2, a plurality of soldering flux pattern groups corresponding to the bonding pad groups respectively are also formed on the substrate; each soldering flux pattern group comprises two soldering flux patterns spaced from one another; the two soldering flux patterns of each soldering flux pattern group are formed on the two bonding pads of the corresponding bonding pad group respectively; and the two tin soldering patterns of each tin soldering pattern group are formed on the soldering flux patterns on the two bonding pads of the corresponding bonding pad group respectively.

4. The method for manufacturing a backlight source according to claim 1, wherein an area of the soldering flux pattern is 0.8 to 1 times an area of the bonding pad thereunder.

5. The method for manufacturing a backlight source according to claim 3, wherein a specific manner of forming a plurality of tin soldering pattern groups spaced from one another on the substrate comprises: firstly providing a tin soldering steel mesh, wherein the tin soldering steel mesh comprises a first shielding portion, a plurality of second shielding portions and a plurality of connecting portions corresponding to the second shielding portions respectively, the first shielding portion is provided with a plurality of openings spaced from one another, and the second shielding portions are located in the openings respectively and are connected to the first shielding portion by the corresponding connecting portions; and next, using the tin soldering steel mesh as a cover to spray a tin soldering material toward the substrate, to form the tin soldering pattern groups spaced from one another on the substrate, each tin soldering pattern group comprising a plurality of closed and ring-shaped tin soldering patterns.

6. The method for manufacturing a backlight source according to claim 3, wherein the soldering flux pattern groups are manufactured by spraying of a steel mesh.

7. The method for manufacturing a backlight source according to claim 3, wherein a thickness of the soldering flux patterns is 1 to 5 micrometers.

8. The method for manufacturing a backlight source according to claim 1, wherein the tin soldering patterns are circular rings or polygonal rings, and a thickness of the tin soldering patterns is 20 to 50 micrometers.

9. The method for manufacturing a backlight source according to claim 1, wherein in the step S4, a change rate of magnetic flux of the space with the varying magnetic field, in which the substrate subjected to the step S3 is placed, is $5\times10^{-4}$-$2\times10^{-3}$ Wb/s, and a temperature at which the tin soldering patterns in the tin soldering pattern groups generate the induced current for heating is 240° C. to 280° C.

10. The method for manufacturing a backlight source according to claim 1, wherein the substrate is a printed circuit board or flexible circuit board.

* * * * *